United States Patent
Hanson et al.

(10) Patent No.: US 10,332,589 B2
(45) Date of Patent: *Jun. 25, 2019

(54) METHOD AND APPARATUS FOR CONTROLLING SUBSTRATE AND WELL BIASES FOR REDUCED POWER REQUIREMENTS

(71) Applicant: Ambiq Micro, Inc., Austin, TX (US)

(72) Inventors: Scott Hanson, Austin, TX (US); Christophe J. Chevallier, Palo Alto, CA (US)

(73) Assignee: Ambiq Micro, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/782,090

(22) Filed: Oct. 12, 2017

(65) Prior Publication Data
US 2018/0211702 A1 Jul. 26, 2018

Related U.S. Application Data

(63) Continuation of application No. 15/412,039, filed on Jan. 22, 2017, now Pat. No. 9,830,974.

(51) Int. Cl.
| | |
|---|---|
| *G11C 11/417* | (2006.01) |
| *G11C 11/412* | (2006.01) |
| *G11C 11/413* | (2006.01) |
| *G11C 5/14* | (2006.01) |

(52) U.S. Cl.
CPC .......... *G11C 11/417* (2013.01); *G11C 11/412* (2013.01); *G11C 11/413* (2013.01); *G11C 5/145* (2013.01); *G11C 5/146* (2013.01)

(58) Field of Classification Search
CPC ..... G11C 11/417; G11C 11/412; G11C 5/146; G11C 5/145
USPC ........................................ 365/154, 156, 147
See application file for complete search history.

(56) References Cited

U.S. PATENT DOCUMENTS

| | | | |
|---|---|---|---|
| 9,830,974 B1* | 11/2017 | Hanson | ................ G11C 11/417 |
| 2012/0274350 A1* | 11/2012 | Reese | ................ G06F 21/6209 |
| | | | 326/8 |
| 2015/0340082 A1* | 11/2015 | Yamamoto | ............. G11C 5/025 |
| | | | 365/51 |

* cited by examiner

*Primary Examiner* — David Lam
(74) *Attorney, Agent, or Firm* — Artie Pennington; Hunt Pennington Kumar & Dula, PLLC (57) ABSTRACT

An SRAM circuit that includes a biasing circuit adapted to selectively bias the transistors of the SRAM array to lower the threshold voltage of selected transistors. The SRAM circuit includes well voltages and positive voltages that are selectively different, and substrate voltages and ground voltages that are selectively different.

7 Claims, 8 Drawing Sheets

METHOD AND APPARATUS FOR CONTROLLING SUBSTRATE AND WELL BIASES FOR REDUCED POWER REQUIREMENTS

CROSS-REFERENCE TO RELATED APPLICATIONS

This application is a Continuation of application Ser. No. 15/412,039, filed 22 Jan. 2017 ("Parent Application"), now U.S. Pat. No. 9,830,974, issued 28 Nov. 2017.

This application claims priority to the Parent Application and hereby claims benefit of the filing dates thereof pursuant to 37 CFR § 1.78(a)(4).

The subject matter of the Parent Application is expressly incorporated herein by reference.

BACKGROUND OF THE INVENTION

1. Field of the Invention

The present invention relates to low power semiconductor memory circuits and methods. More specifically, the present invention relates to Static Random Access Memory ("SRAM") circuits and methods having controlled substrate and well biases and reduced power requirements. The novel low power SRAM circuits and methods are suitable for use in low power microprocessors, microcontrollers, or power management devices.

2. Description of the Related Art

In general, in the descriptions that follow, the first occurrence of each special term of art that should be familiar to those skilled in the art of integrated circuits ("ICs") and systems will be italicized. In addition, when a term that may be new or that may be used in a context that may be new, that term will be set forth in bold and at least one appropriate definition for that term will be provided. In addition, throughout this description, the terms assert and negate may be used when referring to the rendering of a signal, signal flag, status bit, or similar apparatus into its logically true or logically false state, respectively, and the term toggle to indicate the logical inversion of a signal from one logical state to the other. Alternatively, the mutually exclusive Boolean states may be referred to as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Hereinafter, reference to a facility shall mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities of each system. Depending on the intended system application, the several facilities comprising the hardware platform may be integrated onto a single IC, or distributed across multiple ICs. Depending on cost and other known considerations, the electronic components, including the facility-instantiating IC(s), may be embodied in one or more single- or multi-chip packages. However, unless expressly stated to the contrary, the form of instantiation of any facility shall be considered as being purely a matter of design choice.

Figure 1:
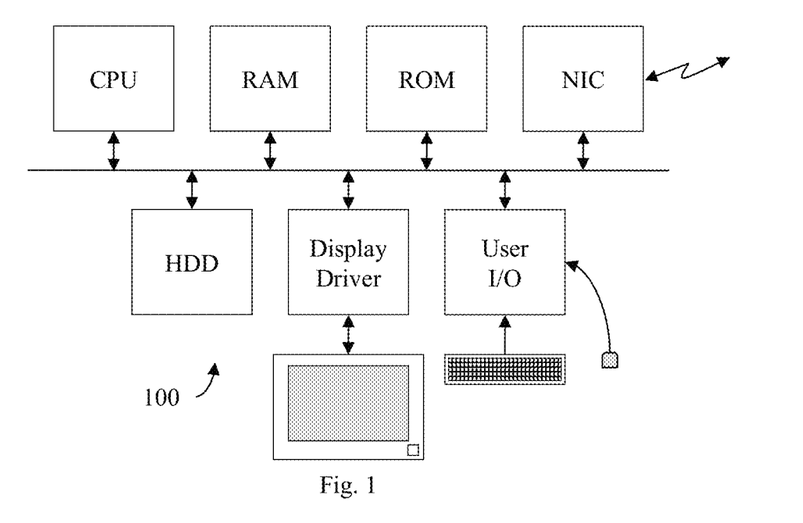
FIG. 1 illustrates, in block diagram form, a general purpose computer system adapted to instantiate any of the several embodiments.
Figure 2:
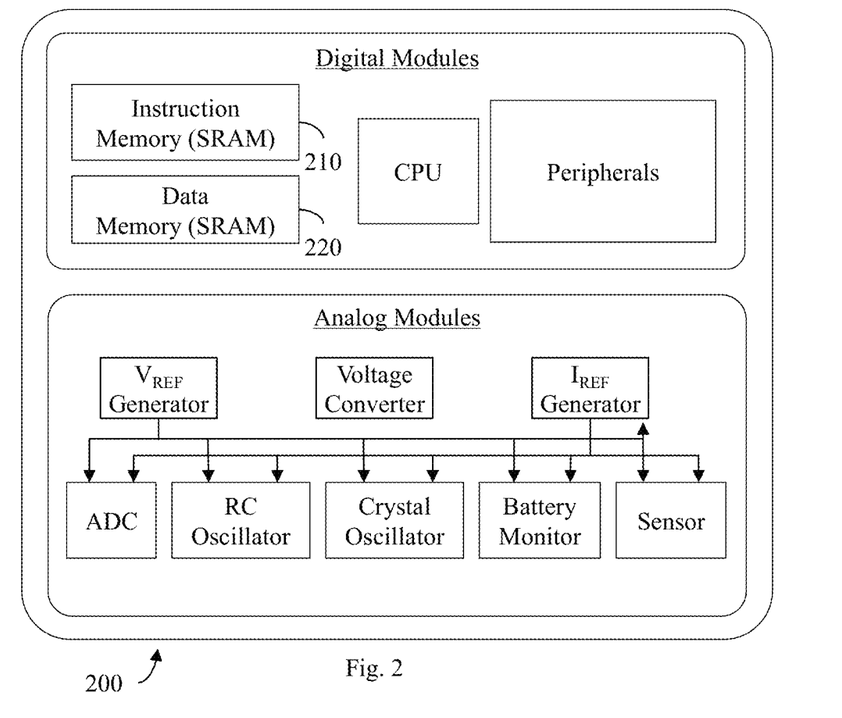
FIG. 2 illustrates, in block diagram form, a typical integrated system adapted to practice any of the several embodiments.

Shown in FIG. 1 is a typical general purpose computer system 100. Although not all of the electronic components illustrated in FIG. 1 may be operable in the sub-threshold or near-threshold domains in any particular embodiment, some, at least, may be advantageously adapted to do so, with concomitant reductions in system power dissipation. In particular, in recently-developed battery powered mobile systems, such as smart-phones, tablets and the like, many of the discrete components typical of desktop or laptop devices illustrated in FIG. 1 are integrated into a single integrated circuit chip. Shown by way of example in FIG. 2 is a typical single-chip microcontroller unit ("MCU") 200 comprising: a central processing unit ("CPU") and at least one static random-access memory ("SRAM") facility 210,220.

SRAM circuits capable of storing digital information are widely used in a variety of mobile and handheld devices, e.g., smart-phones, tablets, laptops, and other consumer electronics products. SRAM facilities may include, without limitation, stand-alone memory circuits, with a dedicated substrate, or embedded memory circuits, where the SRAM circuit shares a substrate with other electronic components.

Figure 3:
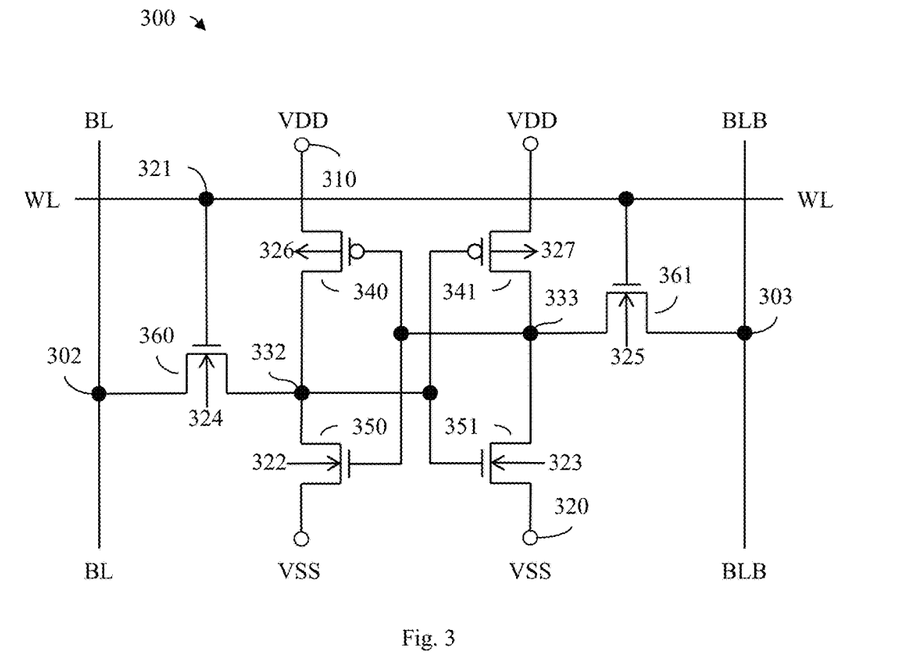
FIG. 3 illustrates, in schematic form, an SRAM cell according to some embodiments.

Typically, SRAM circuits consists of arrays of SRAM bit cells, and surrounding circuits such as decoders, sense amplifiers, write buffers, and control logic. The bit cell consists of a number of transistors. The most common SRAM cell uses 6 Complementary Metal-Oxide-Silicon ("CMOS") transistors, connected as a latch with 2 pass gates, e.g., the 6T SRAM cell. Such a cell is depicted in FIG. 3 and will be described in detail in the following paragraphs. Other configurations of SRAM cells are also anticipated as would be understood by one of ordinary skill in this art of memory design, e.g., 4T SRAM cell or 8T SRAM cell.

As is known, MOS transistors have a gate, a source, a drain and a bulk node. As one of ordinary skill in this art would understand, by applying a voltage on the gate the amount of current that can flow from the drain to the source can be modulated. One of the main characteristics of MOS transistors is its threshold voltage. This voltage quantity, in its simplest definition, is the voltage applied on its gate in order to pass current.

In recent years, due to the growth of portable electronics, there has been a push to lower the supply voltage of the circuits used in portable electronic appliances. With a lower supply voltage, and the concomitant reduction in power, smaller batteries may be used. One industry standard technique used in an SRAM to reduce power is to lower the supply voltage on the SRAM cells during a retention mode. Retention mode, as understood by one of ordinary skill in this art, is a mode where the data stored in the SRAM is neither read nor written, but rather data is maintained in the SRAM cells, all the while the peripheral SRAM logic may be turned off. For some implementations, the supply voltage for the SRAM cells may be lowered for an additional reduction in power. There is, however, a practical limit to how low the supply can be brought during retention mode. As one of ordinary skill in this art would understand, if the supply is brought too low, the characteristics of the transistors in an SRAM cell may result in the cell flipping state, resulting in a loss of data. So, there is a need for a technique where the SRAM cell supply can be brought lower without losing the data stored into said cell. By bringing the SRAM cell supply lower, the power consumed by the SRAM circuit will drop, and this, combined with other power savings, will enable a portable product with longer battery life, or with smaller batteries, and therefore a lighter product.

In the standard 6T SRAM cell mentioned above, typically the voltage to the bulk node of the NMOS devices is the substrate voltage, at a ground supply, and the voltage applied to the bulk node of the PMOS devices is the array supply voltage. In some cases, a bias is applied on the substrate and another bias is applied to the well (also called bulk) of the PMOS devices. These bias voltages differ from the source voltages of these transistors, the bias on the NMOS is more negative that the source of these NMOS devices, the bias on the PMOS is more positive that the source of the PMOS devices. The reason for these biases is usually to enhance functionality by increasing the transistor threshold voltages, which provides for additional margin against noise, and reduces overall leakage.

However, this necessitates the use of larger voltages than the ones already used on chip, which is undesirable. What is needed is an apparatus and method adapted to yield equivalent or better results in term of leakage reduction, without creating the need for higher voltages on-chip, and thus, consuming less power than known prior art.

During the production process, many statistical variations affect each integrated circuit and each transistor inside these integrated circuits. Two kind of variations are observed. First, global variations that affect all transistors on the circuit. These variations are usually referred to as process corners. For example, a gate oxide thicker than average will result in NMOS and PMOS devices having threshold voltages higher than average, resulting in slower transistors at a given bias. Such a corner would be called "slow-slow" process corner. Second, local variations that affect each transistor differently. These local variations will further change the characteristics of each transistor. Process corners sometimes refer to the limit of the range of transistor characteristics, so we will use "process state" to describe the set of physical parameters for a given transistor, which may be anywhere within the range of parameters values. A slow process refers to transistors being on the slow side of the process range. A fast process refers to transistors being on the fast side of the process range. Although it is possible to be in a process state where NMOS transistors are fast and PMOS transistors are slow, and reciprocally, in general, due to the influence of gate oxide thickness, which is shared by NMOS and PMOS transistors, the cases where both types of transistors are in the same speed range at the same time is much more likely. When designing a circuit block for a particular function, it is usually necessary to design the circuitry, size the transistors so that under worst case corner, taking into account global and local variations, the circuit is still functional.

This results in overly conservative sizing for most produced integrated circuits, as the same sizes, the same biases are applied whether the circuit requires it for functionality or not. Therefore, we could greatly benefit from techniques that allow to size circuits more accurately, in particular we could reduce power consumption of SRAM circuits with such techniques.

BRIEF SUMMARY OF THE INVENTION

In one embodiment, in an SRAM facility including an SRAM cell adapted to operate in response to a first supply voltage and a second supply voltage, the cell comprising an NMOS transistor formed in a substrate, and a PMOS transistor formed in a well in the substrate, a method for operating the SRAM facility, the method comprising a mode of operation comprising the steps of developing the first supply voltage at a first voltage, developing the second supply voltage at a second voltage, and developing at least a selected one of a third voltage on the well, the third voltage being a selected one of a voltage lower than the first voltage, a voltage equal to the first voltage, and a voltage higher than the first voltage, and a fourth voltage on the substrate, the fourth voltage being a selected one of a voltage lower than the second voltage, a voltage equal to the second voltage, and a voltage higher than the second voltage.

In another embodiment, in an SRAM facility comprising an SRAM cell adapted to operate in response to a first supply voltage and a second supply voltage, the cell comprising an NMOS transistor formed in a substrate, and a PMOS transistor formed in a well in the substrate, a bias circuit coupled to the SRAM cell, the bias circuit being adapted to operate in response to a digital control value, and output at least a selected one of the first supply voltage, and the second supply voltage, and a register coupled to the bias circuit, the register adapted to store a plurality of digital values, and output the digital control value as a function of a selected one of the plurality of digital values, a method for operating the SRAM facility, the method comprising: [1] storing a first digital value of the plurality of digital values in the register; [2] storing a second digital value of the plurality of digital values in the register; [3] in a first mode of operation comprising the steps of [3.1] developing the digital control value at a first value as a function of the first digital value; [3.2] developing at least a selected one of: [3.2.1] the first supply voltage at a first voltage as a function of the digital control value; and [3.2.2] the second supply voltage at a second voltage as a function of the digital control value; and [4] in a second mode of operation comprising the steps of: [4.1] developing the digital control value at a second value as a function of the second digital value; [4.2] developing at least a selected one of: [4.2.1] the first supply voltage at a third voltage as a function of the digital control value; and [4.2.2] the second supply voltage at a fourth voltage as a function of the digital control value.

In one other embodiment, an SRAM facility is configured to perform the method for operating the SRAM facility.

In yet another embodiment, a memory system comprising an SRAM facility is configured to perform the method for operating the SRAM facility.

In one further embodiment, a computer readable medium is provided including executable instructions which, when executed in a processing system, causes the processing system to perform the method for operating an SRAM facility.

BRIEF DESCRIPTION OF THE SEVERAL VIEWS OF THE DRAWINGS

The several embodiments may be more fully understood by a description of certain preferred embodiments in conjunction with the attached drawings in which.

In the drawings, similar elements will be similarly numbered whenever possible. However, this practice is simply for convenience of reference and to avoid unnecessary proliferation of numbers, and is not intended to imply or suggest that identity is required in either function or structure in the several embodiments.

DETAILED DESCRIPTION

FIG. 3 illustrates, in schematic form, an SRAM cell 300 according to some embodiments. SRAM cell 300 includes: a positive supply ("VDD") 310; a ground supply ("VSS") 320; a word line ("WL") 321; a bit line ("BL") 302; a bit line bar ("BLB") 303; two pull up transistors 340 and 341, the bulk of transistors 340 and 341 respectively tied to bulk nodes 326 and 327; two pull down transistors 350 and 351, the bulk of transistors 350 and 351 respectively tied to bulk nodes 322 and 323; pass gate transistors 360 and 361, the bulk of transistors 360 and 361 respectively tied to bulk nodes 324 and 325. Storage nodes 332 and 333 store a signal representative of the data intended to be stored in this SRAM cell 300. Typically, bulk nodes 326 and 327 are tied together to VDD 310, and bulk nodes 322, 323, 324 and 325 are tied together to node VSS 320.

Figure 4:
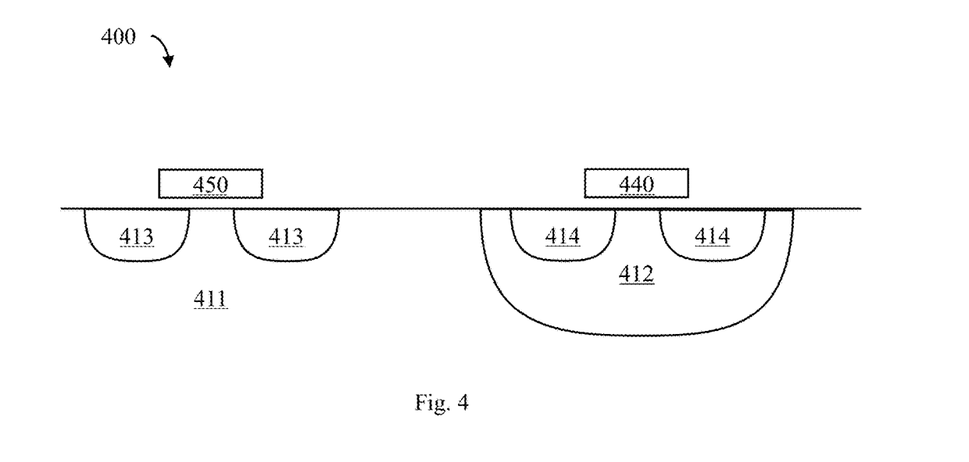
FIG. 4 illustrates a cross-sectional view of a semiconductor substrate having formed therein NMOS and PMOS transistors according to some embodiments.

FIG. 4 illustrates a cross-sectional view 400 of a semiconductor substrate having formed therein NMOS and PMOS transistors according to some embodiments. FIG. 4 further illustrates the construction of part of the SRAM cell 300. Cross-sectional view 400 illustrates the location of the substrate 411 in which an NMOS device is constructed, with gate 450 and source and drain 413, and the location of the bulk 412 in which a PMOS device is constructed, with gate 440 and source and drain 414. According to one embodiment, substrate 411 may be at the same voltage as the source or drain 413 in one mode of operation and substrate 411 may be at a higher voltage than source or drain 413 in a different mode of operation. Similarly, bulk 412 may be at the same voltage as the source or drain 414 in one mode of operation and bulk 412 may be at a lower voltage than source or drain 414 in a different mode of operation. Therefore, the bias applied on the SRAM is defined by the voltages applied on the bulk 412 of the PMOS devices, on the substrate 411 under the NMOS devices, and the voltages applied on the source or drain 414 and respectively source or drain 413. Typical, operation of the SRAM is performed with the ground ("GND" or "VSS") of the SRAM circuit tied to both the substrate 411 and the source 413 of the NMOS transistor and the power supply ("VDD") of the SRAM circuit tied to the bulk 412 and the source 414 of the PMOS transistor. Other permutations are possible with different bias options without departing from the scope of this invention.

An SRAM facility, typically comprising a plurality of SRAM cells, can be operated in different modes. Exemplary modes may include, without limitation: (i) an active mode during which write and read operations are performed; (ii) a standby mode where the SRAM circuit is idle, but can quickly switch back into active modes; (iii) a retention mode where the voltage supply for the SRAM array, including the SRAM cells, is reduced, providing for lower power consumption by the SRAM array while maintaining the data content stored in the SRAM array; and (iv) a power down mode where the majority of the circuitry inside the SRAM facility is powered down, and the data stored in the SRAM array is lost.

A typical practice in a retention mode is to lower the voltage supply of the SRAM cells in the SRAM array to reduce the overall voltage across the transistors of the SRAM cells with a concomitant reduction in power dissipation. An alternative practice in a retention mode is to raise the ground supply of the SRAM cells in the SRAM array, again, to reduce the overall voltage across the transistors of the SRAM cells. However, the reduction in voltage across the transistors of the SRAM cells, either by lowering the supply voltage or raising the ground supply, is limited by the threshold voltages of the transistors in each cell. Once the voltage across the transistors of the SRAM cells nears the threshold voltage of the transistors of the SRAM cells, the SRAM cell's ability to maintain its proper state is compromised. According to one embodiment, data integrity may be maintained by lowering the threshold voltages of selected transistors. As an example, referring to FIG. 3, selective biasing of at least some of the SRAM transistors 340, 341, 350, 351 and 360, 361 provides for lower threshold voltages of the transistors forming the latch of the SRAM cell, and therefore maintains data integrity at a lower voltage than without the bias. The lower supply voltage or higher ground voltage enabled by biasing the transistors of the SRAM cell results in lower, overall power consumption of the SRAM facility while in retention mode.

Various permutations of the embodiment are anticipated. For example, an SRAM facility could have 2 modes of retention. A first mode may be a mode where the well and substrate of SRAM cell transistors are biased at (respectively) power supply and ground level. In this mode, the well supply or well node and the source or drain of the PMOS transistor are both coupled to the power supply and the substrate supply or substrate node and the source or drain of the NMOS transistor are both coupled to the ground supply. A second mode may be a mode where the well and substrate of the SRAM cell transistors are biased at lower well voltage and higher substrate voltage. In this second mode, the well supply or well node is supplied at a lower, i.e., different, voltage than the source or drain of the PMOS transistor and the substrate supply or substrate node is supplied at a higher, i.e., different, voltage than the source or drain of the NMOS transistor.

Figure 5:
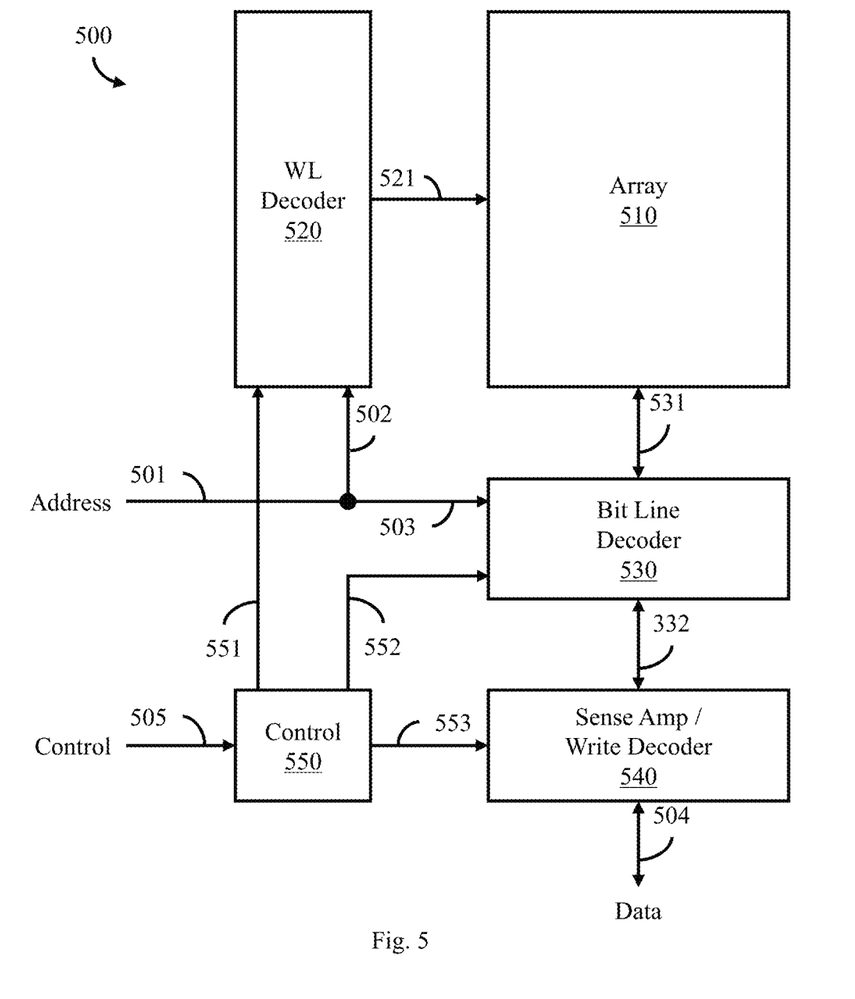
FIG. 5 illustrates, in block diagram form, a typical SRAM facility configuration.

FIG. 5 illustrates, in block diagram form, a typical SRAM facility 500 configuration. In particular, the principal components of SRAM facility 500 include: (i) the SRAM array 510 which includes SRAM cells, i.e., illustrated in FIG. 3 and FIG. 4; (ii) word line decoders 520 adapted to decode the data asserted on the address lines 501 and apply the results of the decode to word lines 521; (iii) bit line decoders 530 adapted to decode the data asserted on the address lines 501 and apply the results and select the associated bit lines for reading or writing of data 504; (iv) sense amp and write driver 540 to respectively read or apply the data 504 associated with the selected cell or cells by way of lines 532. The control block 550 manages which mode of operation is selected, and generates the proper control signals 551, 552 to control the other SRAM facility blocks.

Figure 6:
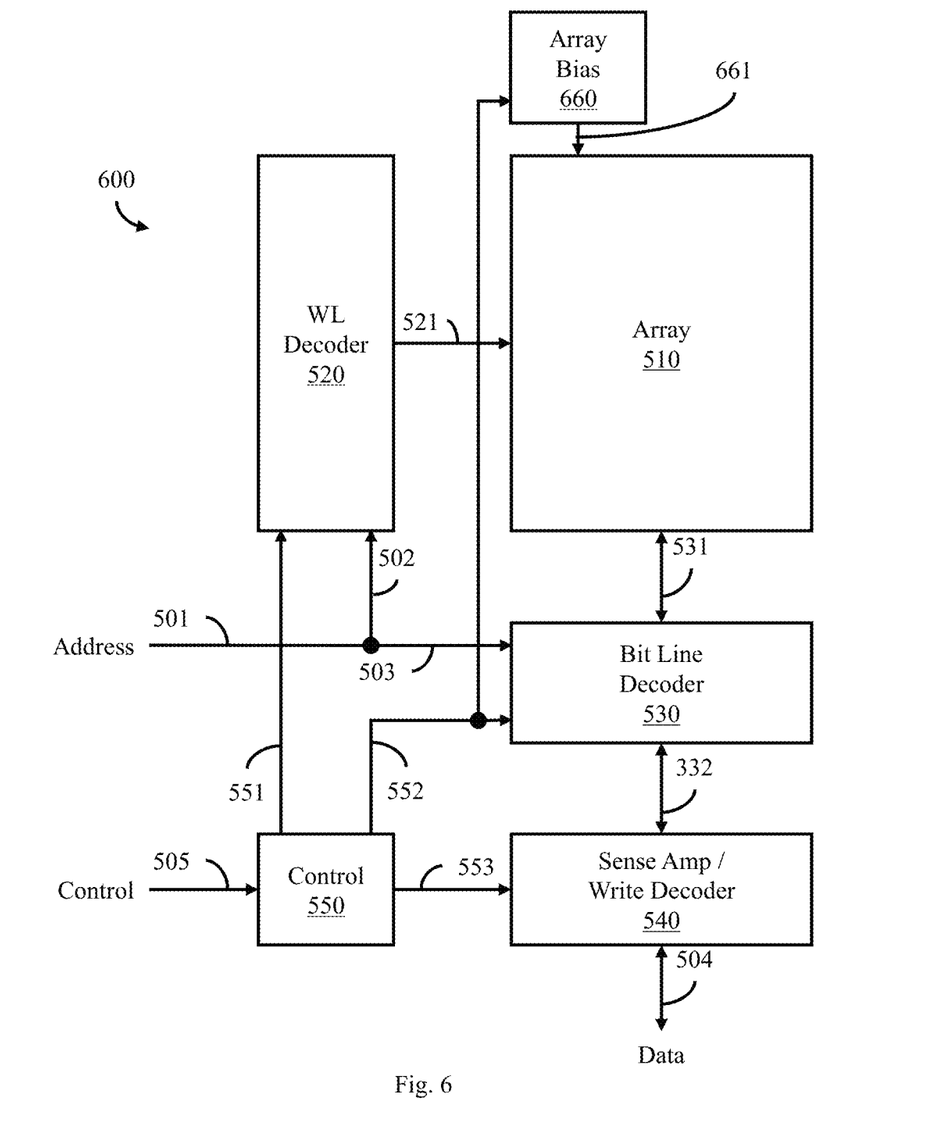
FIG. 6 illustrates, in block diagram form, an SRAM facility accordingly to some embodiments.

FIG. 6 illustrates, in block diagram form, an SRAM facility 600 accordingly to some embodiments. SRAM facility 600 includes all elements of FIG. 5 and, additionally, includes an array bias block 660. The array bias block 660 is coupled to SRAM array 510 by way signals 661 and is adapted to apply a specific bias on the array 610 during a specified mode, i.e., retention mode, active mode, standby mode, etc.

Figure 7:
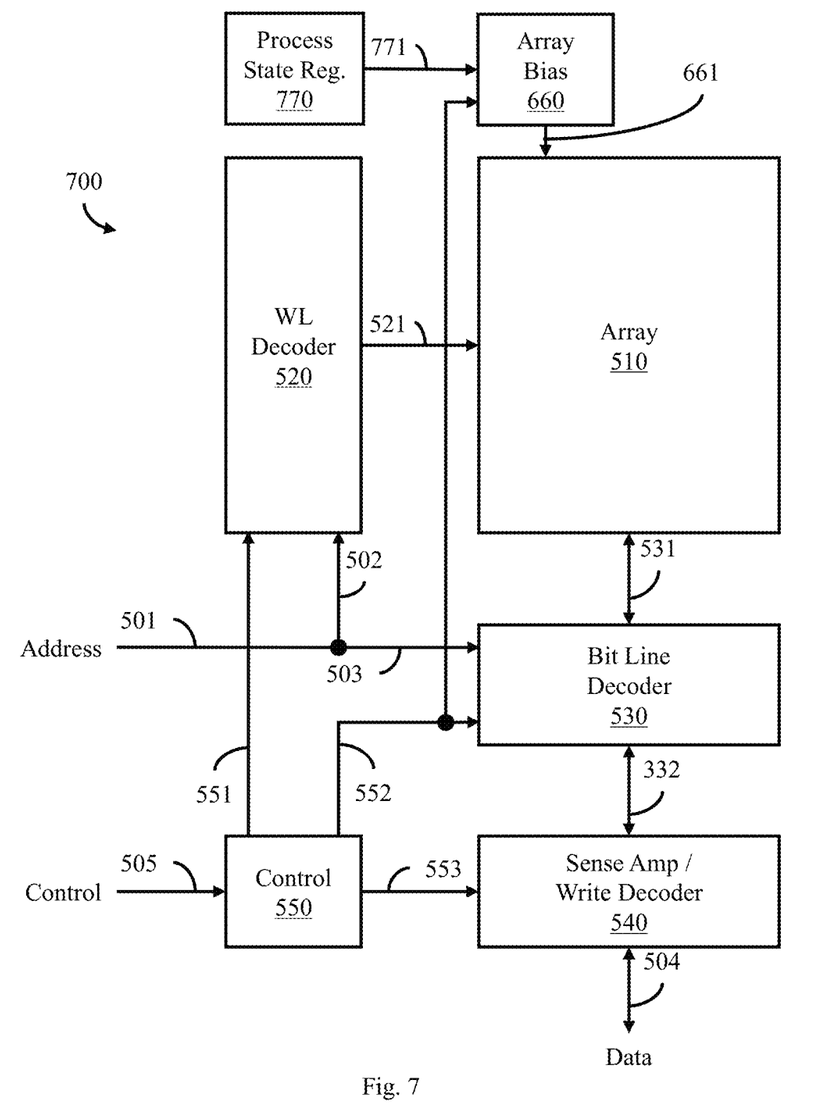
FIG. 7 illustrates, in block diagram form, another SRAM facility accordingly to some embodiments.

FIG. 7 illustrates, in block diagram form, another SRAM facility 700 accordingly to some embodiments. SRAM facility 700 includes all elements of SRAM facility 500 of FIG. 5, with an improved array bias block 660. SRAM facility 700 also includes a process state register block 770. The process state register 770 is adapted to store a digital value that is reflective of the state, or corner process, of the SRAM facility 700, and to output signals 771 that are reflective of the stored digital value. By way of example, if the stored digital value reflects a fast-fast process corner, the array bias block 660 applies a first voltage on the array power supply during retention mode and a second voltage on the array power supply during active mode. However, if the stored digital value reflects a slow-slow process corner, the array bias block 660 applies a third voltage on the array power supply during retention mode and a fourth voltage on the array power supply during active mode. The first, second, third, and fourth voltages are all different, reflecting the various changes in the devices at the respective process corners. These values, in turn, configures array bias block 660 in such a way as to provide a selected array bias to the SRAM array 510, and thus providing the concomitant reduction in power consumption.

Figure 8A:
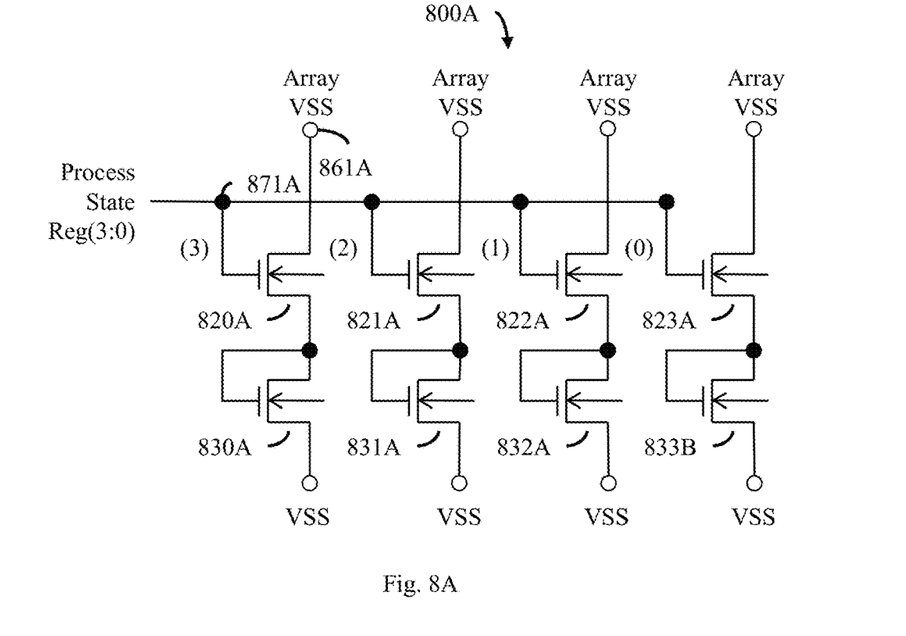
FIG. 8A illustrates, in schematic form, an adjustable bias circuit according to some embodiments.
Figure 8B:
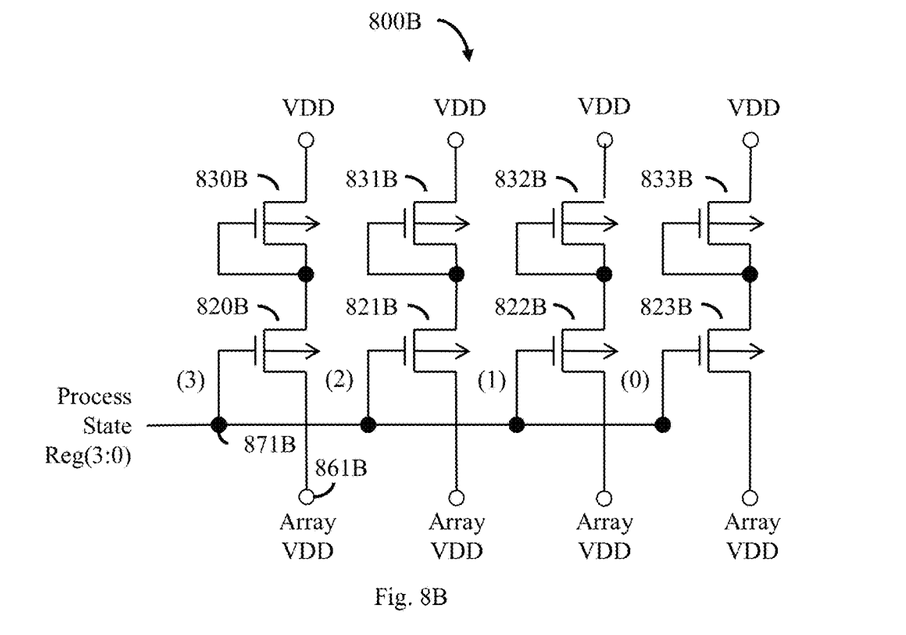
FIG. 8B illustrates, in schematic form, another adjustable bias circuit according to some embodiments.

FIG. 8A illustrates, in schematic form, an adjustable bias circuit 800A according to some embodiments. Adjustable bias circuit 800A includes input signals 871A provided by the process state register 770, which are representative of a selected process state. For a given state, one or more signals 871A are asserted logic_1 and will turn on related transistors 820A. Array VSS 861A is used in lieu of the normal ground supply of the array (see, node 330 of FIG. 3). By way of example referring to FIG. 3, the source of the NMOS transistors 350 and 351 are connected to Array VSS 861A. As one of ordinary skill in this art will understand, asserting a logic_1 on process state register bit 3 will turn on NMOS transistor 820A, and will provide a voltage on array VSS 861A that is higher than the VSS, i.e., the GND node. Additional transistors 821A, 822A, and 823A, may be connected in parallel with transistor 820A by asserting selected bits (2:0) of process state register input 871A resulting in a lower array bias voltage 861A. Conversely, a fewer number of transistors in parallel results in a higher array bias voltage 861A. For efficiency of circuit layout and area, not all transistors, i.e., transistors 830A, 831A, 832A, 833A, 820A, 821A, 822A, and 823A need not to be the same physical size. This exemplary implementation relies on NMOS devices to modulate the low node of the SRAM array, the "array ground", or array VSS 861A. One of ordinary skill in this art understands that a similar circuit could be constructed with PMOS transistors to modulate the high node of the SRAM array, the "array power supply". By way of example, FIG. 8B illustrates, in schematic form, an adjustable bias circuit 800B according to some embodiments. As one of ordinary skill in this art will understand, asserting a logic_0 on process state register bit 3 will turn on PMOS transistor 820B, and will provide a voltage on array VDD 861B that is lower than the VDD. Additional transistors 821B, 822B, and 823B, may be connected in parallel with transistor 820B by asserting selected bits (2:0) of process state register input 871B resulting in a higher array bias voltage 861B. Conversely, a fewer number of transistors in parallel results in a lower array bias voltage 861B. For efficiency of circuit layout and area, not all transistors, i.e., transistors 830B, 831B, 832B, 833B, 820B, 821B, 822B, and 823B need not to be the same physical size. This exemplary implementation relies on PMOS devices to modulate the positive node of the SRAM array, the "array positive supply", or array VDD 861B. Referring back to FIG. 8A, one of ordinary skill will appreciate that a device (not shown) may be added to this array facility 800 to bypass these devices 820A, 821A, 822A, 823A, 830A, 831A, 832A, and 833A when necessary, e.g., when the mode of the SRAM facility is in active mode, or standby mode, or not in retention mode. By switching off all transistors, the SRAM array can be powered down, resulting in the SRAM cell data being lost, but minimum power consumption is achieved. Many possible implementations of this circuit can be developed without departing from the scope of this invention.

Figure 9A:
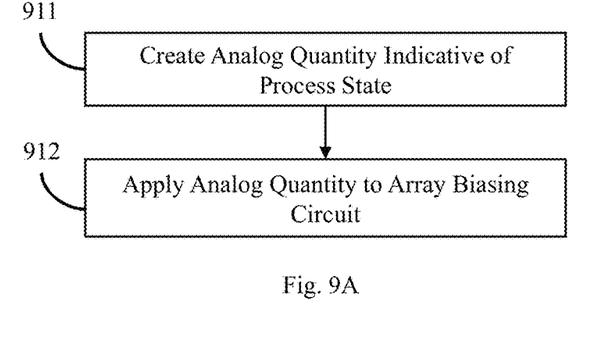
FIG. 9A illustrates, in flow chart form, a method for adjusting the bias of an SRAM circuit, according to some embodiments.

FIG. 9A illustrates, in flow chart form, a method for adjusting the bias of an SRAM circuit, according to some embodiments. According to this method, an analog quantity is derived, that analog quantity being representative of the integrated circuit process state or process corner (see, step 911). For example, the analog quantity may be derived from a circuit including a diode-connected transistor, or diode-configured transistors in series, to reflect the threshold voltages of NMOS and PMOS devices. This analog quantity is applied, in step 912, to the gate of transistors (see, FIG. 8A NMOS 620 or NMOS 630) to modulate the bias on the array. Steps 911 and 912 may also be performed simultaneously.

Figure 9B:
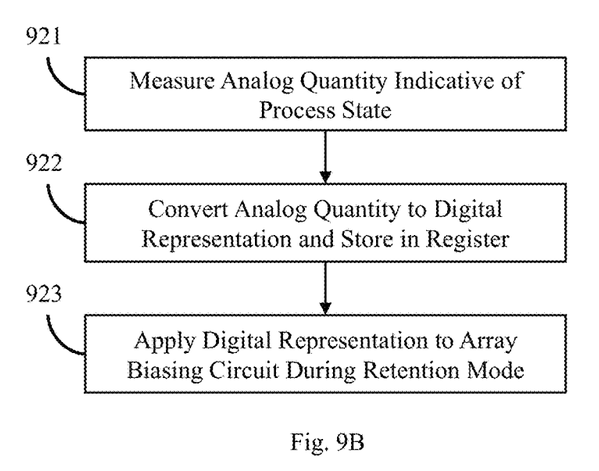
FIG. 9B illustrates, in flow chart form, another method for adjusting the bias of an SRAM circuit according to some embodiments.

FIG. 9B illustrates, in flow chart form, another method for adjusting the bias of an SRAM circuit according to some embodiments. According to this method, the process state or process corner is first measured, and represented by an analog quantity (see, step 921). The measurement is then converted to a digital value which is stored in a register (see, step 922). As an example, the circuit may include a ring oscillator which increments a counter. The counter operates for a fixed period of time based on a known system clock. The counter value is representative of the speed of the ring oscillator, which is dependent on the process state or process corner of the integrated circuit in which it exists. The output of the counter can be applied to signals 871 of FIG. 8A to modulate the bias of the SRAM array (see, step 923). Steps 921 and 922 may be applied prior to step 923, or simultaneously with step 923.

Figure 9C:
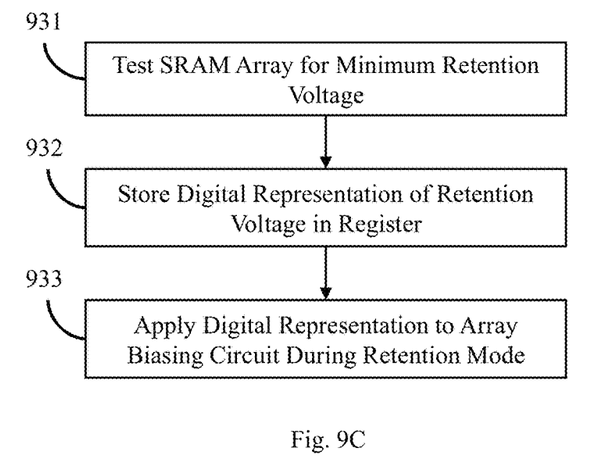
FIG. 9C illustrates, in flow chart form, another method for adjusting the bias of an SRAM circuit according to some embodiments.

FIG. 9C illustrates, in flow chart form, another method for adjusting the bias of an SRAM circuit according to some embodiment. This method represents a two-step method where in a first step 931 the SRAM array is tested to determine its functionality for retention at low voltage. As an example, a retention test (write pattern, lower array supply to retention voltage, wait a certain amount of time (typically in order of milliseconds), raise array supply to nominal voltage, read and compare pattern) is applied with varying retention voltages. The results of such a test are stored in a register (see, step 932). During, for example, retention mode, the information from the register is used to bias the array to the minimum passing retention level (see, step 933). In this embodiment, the first step 731 can be performed once during an initial test phase, and the result of the test can be stored permanently on the integrated circuits, for example in non-volatile memory cells. Alternatively, the test may be performed each time the SRAM array is powered up, or at regular interval while the SRAM array remains powered up. Additionally, the techniques described herein may be further enhanced by using a temperature detector, described below, and applying an offset to the process detector. The aforementioned offset may be a function of the temperature detected, which is also further described below.

Figure 10:
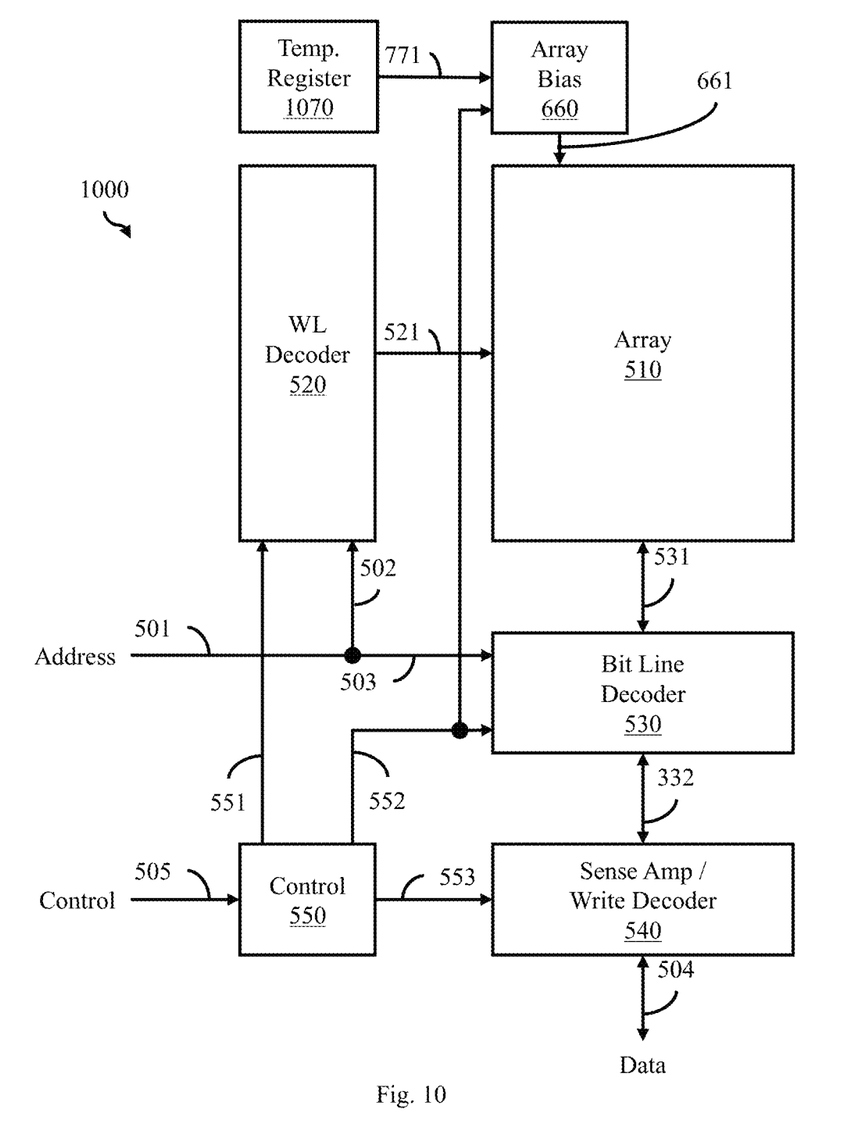
FIG. 10 illustrates in block diagram form, another SRAM facility accordingly to some embodiments.

FIG. 10 illustrates in block diagram form, another SRAM facility 1000 accordingly to some embodiments. SRAM facility 1000 includes all elements of SRAM facility 600 of FIG. 6. SRAM facility 1000 also includes an array bias block 660 and a temperature register block 1070. The temperature register 1070 will output digital signals 771 that reflect selected operating temperature ranges. According to one embodiment, as one of ordinary skill in this art understands, temperature register block 1070 may comprise a temperature detector or a temperature sensor of coupled to an analog-to-digital converter and a register adapted to store the digital output on a periodic basis. These classes of temperature detectors or temperature sensors include, by way of example, diode temperature sensors coupled to an analog-to-digital converter. The output signals of temperature register 1070 will drive the signals 771 that enable array bias 660 to bias the SRAM array 510 in order to minimize power consumption.

According to a different embodiment, temperature register 1070 may be a temperature state register, analogous to the process state register illustrated in FIG. 7, adapted to store a digital value that is reflective of an operating temperature. As one of ordinary skill in the art understands, semiconductor devices may comprise a separate temperature sensor adapted to output a digital value that is reflective of the current operating temperature of the semiconductor device. This digital reflection of the current operating temperature of the semiconductor device is stored in temperature register 1070 and used by SRAM facility 1000. By way of example, the digital value output by a separate temperature sensor on the semiconductor device may be periodically read or accessed by the operating system or by the semiconductor device itself and subsequently stored in the temperature register 1070. Over time, the operating temperature of the semiconductor device may vary. As the temperature of the semiconductor device varies, the operating system, or the semiconductor device, may store a first digital value in the temperature register 1070 reflecting a first operating temperature. As is understood, a subsequent second digital value may be stored in the temperature register 1070, reflecting an increase or a decrease in the operating temperature of the semiconductor device. By way of example, if the stored digital value reflects a first operating temperature, the array bias block 660 applies a first voltage on the array power supply during retention mode and a second voltage on the array power supply during active mode. Similarly, the array bias block 660 applies a third voltage on the array ground supply during retention mode and a fourth voltage on the array ground supply during active mode. A second digital value reflecting a second operating temperature may subsequently be stored in temperature register 1070. The array bias block 660 applies a fifth voltage on the array power supply during retention mode and a sixth voltage on the array power supply during active mode. Similarly, the array bias block 660 applies a seventh voltage on the array ground supply during retention mode and an eighth voltage on the array ground supply during active mode. The differing voltages reflect the various changes in the devices at the respective operating temperature. These values, in turn, configures array bias block 660 in such a way as to provide a selected array bias to the SRAM array 510, and thus providing the concomitant reduction in power consumption.

According to some embodiments, one or more of the sub-circuit blocks described in the various figures herein need not be resident on the same substrate. In other embodiments, the temperature detector can be located off chip and the temperature information may be provided to a register controlling the array bias facility by way of software.

Although described in the context of particular embodiments, one of ordinary skill in this art will readily realize that many modifications may be made in such embodiments to adapt either to specific implementations.

Thus it is apparent that a method and apparatus adapted to size circuits more accurately, in particular we could reduce power consumption of SRAM circuits with such techniques while consuming less power than known prior art has been disclosed. Further, we submit that our method and apparatus provides performance generally superior to the best prior art techniques.

What is claimed is:

1. In an SRAM facility comprising:
   an SRAM cell adapted to operate in response to a first supply voltage and a second supply voltage, said cell comprising:
      an NMOS transistor formed in a substrate; and
      a PMOS transistor formed in a well in said substrate;
   a method for operating said SRAM facility to maintain data integrity of said SRAM cell by lowering a threshold voltage of at least a selected one of said PMOS transistor and said NMOS transistor, said method comprising:
      a mode of operation comprising the steps of:
         developing said first supply voltage at a first voltage;
         developing said second supply voltage at a second voltage; and
         developing at least a selected one of:
            a third voltage on said well, said third voltage being a selected one of:
               a voltage lower than said first voltage, said developing of said third voltage lower than said first voltage lowering said threshold voltage of said PMOS transistor to maintain data integrity of said SRAM cell; and
               a voltage equal to said first voltage; and
            a fourth voltage on said substrate, said fourth voltage being a selected one of:
               a voltage equal to said second voltage; and
               a voltage higher than said second voltage, said developing of said fourth voltage higher than said second voltage lowering said threshold voltage of said NMOS transistor to maintain data integrity of said SRAM cell.

2. The method of claim 1 wherein:
   said mode is further characterized as a retention mode;
   said third voltage is further characterized as being lower than said first voltage; and
   said fourth voltage is further characterized as being higher than said second voltage.

3. The method of claim 1 wherein:

said mode is further characterized as an active mode;

said third voltage is further characterized as being equal to said first voltage; and said fourth voltage is further characterized as being equal to said second voltage.

4. In an SRAM facility comprising:

an SRAM cell adapted to operate in response to a first supply voltage and a second supply voltage, said cell comprising:
- an NMOS transistor formed in a substrate; and
- a PMOS transistor formed in a well in said substrate;

a bias circuit coupled to said SRAM cell, said bias circuit being adapted to:
- operate in response to a digital control value; and
- output at least a selected one of:
  - said first supply voltage; and
  - said second supply voltage; and a register coupled to said bias circuit, said register adapted to:
- store a plurality of digital values; and
- output said digital control value as a function of a selected one of said plurality of digital values;

a method for operating said SRAM facility, said method comprising:
- [1] storing a first digital value of said plurality of digital values in said register;
- [2] storing a second digital value of said plurality of digital values in said register;
- [3] in a first mode of operation comprising the steps of:
  - [3.1] developing said digital control value at a first value as a function of said first digital value;
  - [3.2] developing at least a selected one of:
    - [3.2.1] said first supply voltage at a first voltage as a function of said digital control value; and
    - [3.2.2] said second supply voltage at a second voltage as a function of said digital control value; and
- [4] in a second mode of operation comprising the steps of:
  - [4.1] developing said digital control value at a second value as a function of said second digital value;
  - [4.2] developing at least a selected one of:
    - [4.2.1] said first supply voltage at a third voltage as a function of said digital control value; and
    - [4.2.2] said second supply voltage at a fourth voltage as a function of said digital control value.

5. An SRAM facility configured to perform the steps of a method according to any one of claims 1 to 4.

6. A memory system comprising an SRAM facility according to claim 5.

7. A non-transitory computer readable medium including executable instructions which, when executed in a processing system, causes the processing system to perform the steps of a method according to any one of claims 1 to 4.

* * * * *